(12) United States Patent
Scheiper et al.

(10) Patent No.: US 8,377,773 B1
(45) Date of Patent: Feb. 19, 2013

(54) TRANSISTORS HAVING A CHANNEL SEMICONDUCTOR ALLOY FORMED IN AN EARLY PROCESS STAGE BASED ON A HARD MASK

(75) Inventors: Thilo Scheiper, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/285,600

(22) Filed: Oct. 31, 2011

(51) Int. Cl.
*H01L 21/8238* (2006.01)

(52) U.S. Cl. .. 438/223; 438/276; 438/289; 257/E21.409

(58) Field of Classification Search ............... 438/197, 438/199, 218, 221, 223, 275, 276, 289; 257/E21.409
See application file for complete search history.

(56) References Cited

U.S. PATENT DOCUMENTS

| | | | |
|---|---|---|---|
| 6,861,304 B2* | 3/2005 | Hisamoto et al. | 438/197 |
| 7,199,017 B2 | 4/2007 | Gonzalez et al. | |
| 7,993,998 B2* | 8/2011 | Chen et al. | 438/199 |
| 2001/0003364 A1 | 6/2001 | Sugawara et al. | |
| 2006/0105533 A1 | 5/2006 | Chong et al. | |
| 2008/0079086 A1 | 4/2008 | Jung et al. | |
| 2008/0227250 A1 | 9/2008 | Ranade et al. | |
| 2010/0155855 A1* | 6/2010 | Anderson et al. | 257/392 |
| 2010/0193881 A1 | 8/2010 | Kronholz et al. | |
| 2010/0289090 A1 | 11/2010 | Kronholz et al. | |
| 2011/0068369 A1* | 3/2011 | Cheng et al. | 257/192 |

FOREIGN PATENT DOCUMENTS

DE 102009006886 A1 8/2010

OTHER PUBLICATIONS

Isheden et al., "pMOSFETs with recessed and selectively regrown Si1-xGex source/drain junctions," Materials Science in Semiconductor Processing, 8:359-62, 2005.
Widmann et al., Technologie hochintegrierter Schaltungen, 2nd edition, Berlin, Springer 1996, pp. 66-67 and 335-340.
Translation of Official Communication from German Patent Office for German Patent Application No. 10 2009 021 484.4-33 dated Feb. 2, 2010.
Translation of Official Communication from German Patent Office for German Patent Application No. 10 2009 021 484.4-33 dated Oct. 25, 2010.

* cited by examiner

*Primary Examiner* — Tuan N. Quach
(74) *Attorney, Agent, or Firm* — Williams, Morgan & Amerson, P.C.

(57) ABSTRACT

Generally, the present disclosure is directed to methods for adjusting transistor characteristics by forming a semiconductor alloy in the channel region of the transistor during early device processing. One disclosed method includes forming an isolation structure in a semiconductor layer of a semiconductor device and in a threshold voltage adjusting semiconductor alloy formed on the semiconductor layer, the isolation structure laterally separating a first active region and a second active region. The method also includes introducing a first and second well dopant species through the threshold voltage adjusting semiconductor alloy and into the first and second active regions, respectively, then removing the threshold voltage adjusting semiconductor alloy selectively from the second active region, and forming a first gate electrode structure of a first transistor on the threshold voltage adjusting semiconductor alloy of the first active region a second gate electrode structure of a second transistor on the second active region.

20 Claims, 10 Drawing Sheets

TRANSISTORS HAVING A CHANNEL SEMICONDUCTOR ALLOY FORMED IN AN EARLY PROCESS STAGE BASED ON A HARD MASK

BACKGROUND OF THE INVENTION

1. Field of the Invention

Generally, the present disclosure relates to integrated circuits including advanced transistor elements, some of which comprise a semiconductor alloy for adjusting transistor characteristics, in particular in the context of sophisticated gate electrode structures.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel and P-channel transistors, are formed on a substrate including a crystalline semiconductor layer. A field effect transistor, irrespective of whether an N-channel transistor or a P-channel transistor is considered, typically comprises so-called PN junctions that are formed by an interface between highly doped regions, referred to as drain and source regions, and a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon and/or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid, among other things, the so-called short channel behavior during transistor operation. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 µm may require a gate dielectric made of silicon dioxide as thin as approximately 1.2 nm. Although generally usage of high speed transistor elements having an extremely short channel may be restricted to high speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode so as to replace the usually used polysilicon material, since polysilicon may suffer from charge carrier depletion at the vicinity of the interface separating the gate dielectric from the electrode material, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the high-k dielectric material within the channel region of the transistor device, in order to appropriately "adapt" the band gap of the specifically designed semiconductor material to the work function of the metal-containing gate electrode material, thereby obtaining the desired threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and thus the threshold voltages, as is the case in so-called replacement gate approaches.

Although, in the approach of providing the threshold voltage adjusting semiconductor alloy in an early manufacturing phase, significant yield loss and reduced transistor performance and increased variability of transistor characteristics is observed, in particular in highly scaled transistor elements, which is believed to be at least in part caused by non-uniformities of the threshold voltage adjusting semiconductor alloy in combination with the pronounced surface topography of isolation regions in a transition area between an active region and the isolation structure, as will be described in more detail with reference to FIGS. 1a-1c.

FIG. 1a schematically illustrates a cross-sectional view of a semiconductor device 100 in an early manufacturing stage. As illustrated, the device 100 comprises a substrate 101, such as a semiconductor substrate and the like, above which is formed a semiconductor layer 102, which is typically provided in the form of a silicon material. Depending on the device architecture to be implemented in the device 100, the semiconductor layer 102 is directly formed on a crystalline material of the substrate 101 in a bulk configuration, while, in a silicon-on-insulator (SOI) architecture, a buried insulating material (not shown) is formed directly below the semiconductor layer 102. In the manufacturing stage shown, the semiconductor layer 102 is laterally divided into a plurality of active regions 102a, 102b by means of an isolation structure 102c, which is typically provided in the form of a shallow trench isolation. In the example of FIG. 1a, the active region 102a is to be understood as an active region for receiving one or more P-channel transistors, which require an appropriate adaptation of the threshold voltage in combination with a sophisticated high-k metal gate electrode structure, as is discussed above. On the other hand, the active region 102b corresponds to one or more N-channel transistors in which the threshold voltage may be adjusted on the basis of the semiconductor base material and the sophisticated high-k metal gate electrode structure. Consequently, the active region 102a receives a silicon/germanium alloy 103 having an appropriate material composition and a specific layer thickness, as these two parameters significantly determine the finally obtained shift of the threshold voltage. For example, typically a thickness of the material 103 is selected in a range of 6-50 nm, while the germanium content of the layer 103 is selected in the range of approximately 15-30 atomic percent. It turns out, however, that the transistor characteristics significantly depend on a precise adjustment of these parameters, which becomes increasingly difficult when, in particular, the transistor width, indicated by 102w, is reduced in sophisticated transistors, for instance when provided in memory areas of the semiconductor device 100. For example, it has been observed that the thickness of the layer 103 is locally increased at the edge of the active region 102a, as indicated by 103e, thereby forming moderately pronounced elevated portions 103d. On the other hand, the layer thickness in the center of the active region 102a, indicated by 103c, may be significantly reduced compared to the thickness 103e. Consequently, in transistor architectures in which the width 102w is increasingly reduced, the influence of the edge portions 103d increases and may thus result in a pronounced shift of the overall transistor characteristics compared to the target characteristics.

FIG. 1b schematically illustrates the semiconductor device 100 in a situation in which the width 102w is reduced, for instance required in narrow transistors for memory areas so that the fraction of the elevated portions 103d becomes increasingly greater, thereby shifting the threshold voltage characteristics, in particular with respect to other transistors having an increased transistor width. In this case, it is very difficult to target the DC behavior and the AC behavior of the device 100 and thus requires a design which takes into account the pronounced variability in the transistor characteristics due to the thickness variation of the threshold voltage adjusting semiconductor alloy 103.

The semiconductor device 100 as illustrated in FIGS. 1a and 1b may be formed on the basis of the following process strategy. The isolation structure 102c is typically formed by applying well-established lithography, etch, deposition, planarization and anneal techniques in order to form trenches in the semiconductor layer 102 so as to extend to a desired depth and subsequently filling the trenches with an appropriate dielectric material, such as silicon dioxide. Typically, the lithography process is applied so as to provide an appropriate hard mask regime, which may also be used for removing any excess material and obtaining a desired height level of the isolation regions 102c. After the removal of any excess material, one or more appropriate well dopant species are introduced into the active regions 102a, 102b in order to adjust the basic transistor characteristics, thereby using well-established masking regimes and implantation processes. Thereafter, the well dopant species may be activated by performing an anneal process, followed by the deposition of the silicon/germanium alloy 103. To this end, a hard mask material is typically formed on the active region 102b, for instance in the form of a silicon dioxide material, and a selective epitaxial growth process is applied in which process parameters, such as temperature, gas flow rates and the like, are appropriately selected such that a deposition is restricted to exposed crystalline surface areas, while adhesion of material on dielectric surface areas, such as silicon dioxide, is strongly suppressed. During the selective process, appropriate precursor materials, including silicon and germanium, are supplied in a well-controlled manner in order to obtain the desired material composition of the layer 103. Similarly, for given process parameters and thus a given deposition rate, the process time is selected so as to obtain the target layer thickness. Moreover, since generally the epitaxial growth is a complex process step, it is of great importance in volume production process environments to provide superior throughput so that typically so-called batch processes are applied in which a plurality of substrates are commonly processed on the basis of a corresponding batch process tool. For example, the deposition of the layer 103 is typically accomplished in a corresponding process tool in which 25 or significantly more substrates may be processed in a single process step, thereby providing superior overall throughput. However, with reduced feature sizes, increasingly the variability of the layer 103 with respect to layer thickness is observed, as discussed above, which requires superior process recipes, which are currently still under investigation, while, in other cases, it has been proposed to use single substrate process tools in order to establish the selective epitaxial growth ambient. Since any improved process recipes for batch processes are currently not available, with a highly unsure prospective of an availability of such process recipes, and since a process flow based on a single wafer processing requires an enormous increase of the tool resources, there is still room for improving the current situation with respect to providing a threshold voltage adjusting semiconductor alloy selectively for certain transistor types.

FIG. 1c schematically illustrates the semiconductor device 100 in a further advanced manufacturing stage. As shown, a sophisticated gate electrode structure 160 is formed on the active region 102a comprising the semiconductor alloy 103 and extends above a portion of the isolation region 102c. The gate electrode structure 160 comprises a gate dielectric layer 161 comprising a high-k dielectric material, as discussed above, in order to obtain an acceptable physical thickness and thus an acceptable leakage behavior, while at the same time achieving a desired high capacitive coupling. Moreover, as is also explained above, typically a metal-containing electrode material 162, for instance comprising titanium nitride and the like, is formed on the gate dielectric layer 161, followed by a further electrode material 163, such as a silicon material, a silicon/germanium material and the like. Moreover, in the manufacturing stage shown, a dielectric cap layer or cap layer system 164 may still be present in the gate electrode structure 160. Moreover, since the materials 161, 162 in combination with the layer 103 define the overall transistor characteristics, for instance with respect to threshold voltage and the like, in combination with other transistor characteristics, such as the dopant profile in the active region 102a, any influence on the material characteristics of these materials is to be reduced during the further processing, thereby requiring an efficient encapsulation of the materials 161 and 162, which is typically accomplished by providing an appropriate protective liner or spacer 165, for instance provided in the form of a dense silicon nitride material and the like. For example, the spacer 165 is provided in order to avoid undue chemical interaction with efficient wet chemical recipes which are typically to be applied during the further processing of the device 100.

Upon forming the layer 103 based on the selective epitaxial growth process as discussed above, usually a pronounced surface topography may be created in the isolation region 102c adjacent to the active region 102a so that a certain divot is frequently observed, in particular in the vicinity of active regions having formed therein the threshold voltage adjusting semiconductor alloy 103. Consequently, upon forming the gate electrode structure 160, which requires the deposition and patterning of the materials 161 and 162 in order to provide appropriate work function metal species for different types of transistors, sophisticated patterning conditions may then be encountered upon patterning the layer stack including the layer 163 and 164, which may finally result in patterning related irregularities, in particular at an end portion 160e of the gate electrode structure 160. Moreover, upon depositing and patterning the spacer 165, the pronounced surface topography may also increase the probability of obtaining insufficient coverage of the sensitive materials 161 and 162, which may thus be exposed during the further processing of the device 100.

In order to reduce the overall non-uniformities of the semiconductor alloy 103, various approaches have been proposed, for instance by using an additional masking process when selectively removing a hard mask material from one of the active regions, for instance from the active region 102b (FIG. 1a). In this manner, a high degree of symmetry is obtained with respect to causing material erosion in the isolation region 102c upon forming the alloy 103 selectively in one type of active region. On the other hand, an additional lithography step and corresponding patterning processes are required, thereby also leading to increased overall process complexity. In other approaches, the semiconductor alloy 103 is grown prior to forming the isolation region 102c, as suggested in "Enhancing Uniformity of a Channel Semiconductor Alloy by Forming STI Structures After the Growth Process" by Stephan Kronholz, Martin Trentzsch and Richard Carter in US Patent Publication No. 2010/0289090, the entire disclosure which is herein incorporated by reference. In this application, basically the semiconductor alloy may be formed in an early manufacturing stage on the basis of a global deposition of the alloy, thereby contributing to superior uniformity while, however, not addressing the incorporation of well dopant species with respect to the overall process flow, in particular with respect to the provision of a hard mask material and the performance of a high temperature anneal process in order to activate the well dopant species and reduce implantation-induced damage, for instance, in the semiconductor alloy.

In view of this situation, the present disclosure relates to manufacturing techniques for forming semiconductor devices requiring, in some active regions, the formation of a threshold voltage adjusting semiconductor alloy, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which an overall process flow is provided to address the above-specified problems and achieve superior characteristics of sophisticated gate electrode structures and transistors, while at the same time providing the possibility of employing highly efficient batch processes for growing the threshold voltage adjusting semiconductor alloy.

One illustrative method disclosed herein comprises forming an isolation structure in a semiconductor layer of a semiconductor device and in a threshold voltage adjusting semiconductor alloy that is formed on the semiconductor layer. The isolation structure laterally separates a first active region and a second active region. The method further comprises introducing a first well dopant species into the first active region and a second well dopant species into the second active region, wherein the well dopant species are introduced through the threshold voltage adjusting semiconductor alloy. Additionally, the method comprises removing the threshold voltage adjusting semiconductor alloy selectively from the second active region having formed therein the second well dopant species. Furthermore, a first gate electrode structure of a first transistor is formed on the layer of a semiconductor alloy and a second gate electrode structure of a second transistor is formed on the second active region.

A further illustrative method disclosed herein comprises forming an isolation structure in a semiconductor layer of a semiconductor device and in a threshold voltage adjusting semiconductor alloy that is formed on the semiconductor alloy, wherein the isolation structure laterally separates a first active region and a second active region. The method further comprises forming a hard mask so as to expose the threshold voltage adjusting semiconductor alloy of the second active region. Moreover, a first well dopant species is introduced into the first active region and a second well dopant species is introduced into the second active region in the presence of the hard mask. The method further comprises removing the threshold voltage adjusting semiconductor alloy selectively from the second active region by using the hard mask. Furthermore, the method comprises forming a first gate electrode structure of a first transistor on the threshold voltage adjusting semiconductor alloy of the first active region and forming a second gate electrode structure of a second transistor on the second active region.

A still further illustrative method disclosed herein comprises introducing a first well dopant species and a second well dopant species into a first area and a second area, respectively, of a semiconductor layer of a semiconductor device. The method further comprises forming a threshold voltage adjusting semiconductor alloy above the semiconductor layer. Moreover, the method comprises forming an isolation structure in the semiconductor layer and in the threshold voltage adjusting semiconductor alloy, wherein the isolation structure laterally separates a first active region and a second active region, and wherein the first active region is formed within the first area and the second active region is formed within the second area. The method further comprises removing the threshold voltage adjusting semiconductor alloy selectively from the second active region by using a hard mask. Additionally, the method comprises forming a first gate electrode structure of a first transistor on the threshold voltage adjusting semiconductor alloy of the first active region and forming a second gate electrode structure of a second transistor on the second active region, wherein the first and second gate electrode structures comprise a gate dielectric layer including a high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
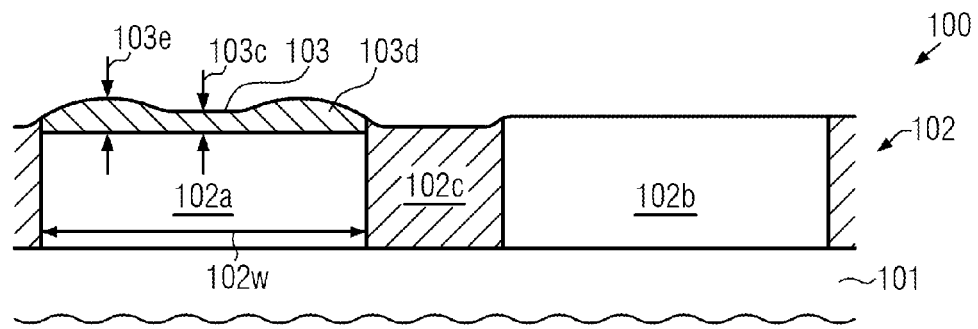
FIGS. 1a-1b schematically illustrate cross-sectional views of active regions, one of which receives a semiconductor alloy for adjusting threshold voltage characteristics, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which a threshold voltage adjusting semiconductor alloy, such as a silicon/germanium material, is selectively provided in some active regions, for instance required for adjusting transistor characteristics, in combination with sophisticated high-k metal gate electrode structures, wherein the semiconductor alloy is formed prior to providing an isolation structure, while at the same time a superior overall process flow is implemented in order to enhance overall process efficiency. To this end, in some illustrative embodiments, the growth of the semiconductor alloy may be accomplished in a batch process, thereby providing the possibility of concurrently processing a plurality of substrates, which in turn results in superior overall process throughput. Furthermore, the patterning of the semiconductor alloy may be accomplished on the basis of a hard mask material, the deposition and patterning thereof is appropriately coordinated with the incorporation of well dopant species in order to provide high process efficiency and superior characteristics of the threshold voltage adjusting semiconductor alloy.

Figure 1B:
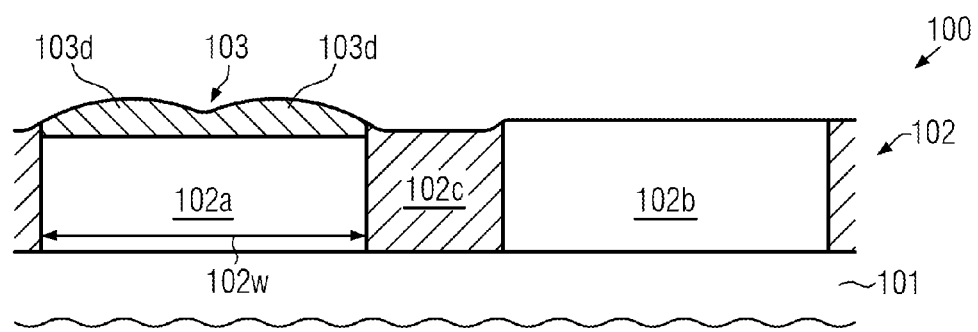
Figure 1C:
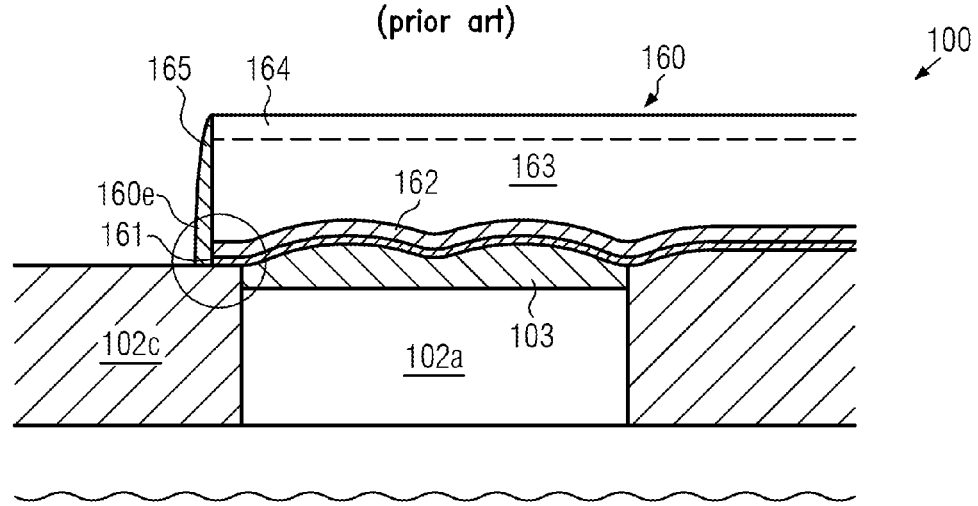
FIG. 1c schematically illustrates the semiconductor device in a further advanced manufacturing stage wherein a pronounced surface topography within an isolation structure may cause inferior encapsulation of sensitive gate materials, according to conventional process strategies.

With reference to FIGS. 2a-2t and FIGS. 3, 4 and 5, further illustrative embodiments will now be described in more detail, wherein reference may also be made to FIGS. 1a-1c, if required.

Figure 2A:
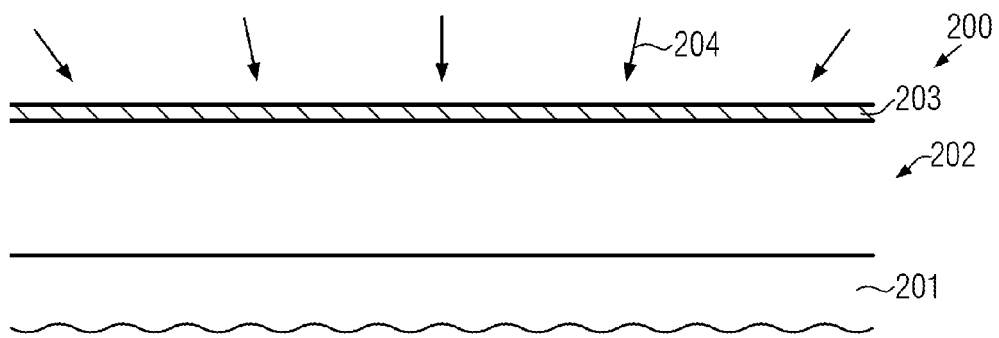
FIGS. 2a-2n schematically illustrate cross-sectional views along a width direction of a semiconductor device during various manufacturing stages in which a threshold voltage adjusting semiconductor alloy is formed in an early manufacturing stage based on a hard mask and an appropriate process regime for implementing well dopant species, according to illustrative embodiments.

FIG. 2a schematically illustrates a cross-sectional view of a semiconductor device 200 in an early manufacturing stage in which a semiconductor layer 202, such as a silicon-based crystalline semiconductor material, is formed above a substrate 201, which may represent any appropriate carrier material. For example, the semiconductor layer 202 and the substrate 201 may form a bulk configuration in which a crystalline material of the layer 202 directly connects to a crystalline semiconductor material of the substrate 201. In other cases, a buried insulating material (not shown) is directly formed below the semiconductor layer 202, thereby providing an SOI architecture. It should be appreciated that, in this manufacturing stage, at least a significant portion of the substrate 201, which is typically provided as a wafer, is covered by the semiconductor layer 202. Hence, a substantially flat surface topography is provided by the layer 202 in this manufacturing stage, except for an edge region (not shown) of the wafer and the like. It should be understood, however, that, in other illustrative embodiments, the layer 202 may not necessarily span the entire wafer but may be divided into several layer portions, each of which, however, may be appropriately dimensioned in order to provide a plurality of active regions still to be formed in the semiconductor layer 202 on the basis of isolation regions.

In this manufacturing stage, a threshold voltage adjusting semiconductor alloy 203, such as a silicon/germanium material and the like, is formed on the semiconductor layer 202. To this end, any well-established deposition process 204 may be used on the basis of appropriate precursor gases and process parameters, wherein the layer thickness and the material composition of the layer 203 may be adjusted with superior uniformity due to the highly uniform surface conditions of the layer 202 compared to other conventional approaches in which isolation structures are already provided in the semiconductor layer 202. In one illustrative embodiment, the deposition process 204 is performed as a batch process in which a plurality of substrates 201 (not shown) are concurrently processed in an appropriate deposition atmosphere, thereby providing high throughput, while nevertheless obtaining superior uniformity of the characteristics of the layer 203, irrespective of the final dimensions of active regions still to be formed in the semiconductor layer 202 and the material 203. That is, in illustrative embodiments, the material 203 is preserved after the deposition process 204 in any area of the semiconductor layer 202, irrespective of whether an area is to be formed into the active region of a P-channel transistor, an N-channel transistor or an isolation region.

The layer 203 may be provided with a predefined material composition, for instance in terms of a germanium concentration, when the material 203 is provided in the form of a silicon/germanium material. For example, a germanium concentration of approximately 10-30 atomic percent or higher may be implemented, wherein the material composition may even vary along the thickness of the layer 203, if considered appropriate for the desired transistor characteristics. Furthermore, after performing the deposition process 204, additional processes may be applied in order to re-adjust the material composition, for instance by applying an oxidation process and the like, which may result in a germanium concentration in a remaining layer if an increased germanium concentration is considered advantageous and may not be efficiently obtained during the deposition 204. Moreover, based on the superior surface topography in this manufacturing stage, a lateral modification may also be efficiently performed selectively in some areas of the device 200 or different degrees of modification may be applied in order to provide the material 203 with different characteristics, for instance a different thickness, different material composition and the like. To this end, any well-established lithography processes may be applied. Moreover, it should be appreciated that the layer 203 may be provided with a thickness of approximately 5-50 nm so that, for instance, a modification or re-adjustment of the layer thickness may not unduly affect the further processing, even if a corresponding modification may be performed selectively within the material 203.

Figure 2B:
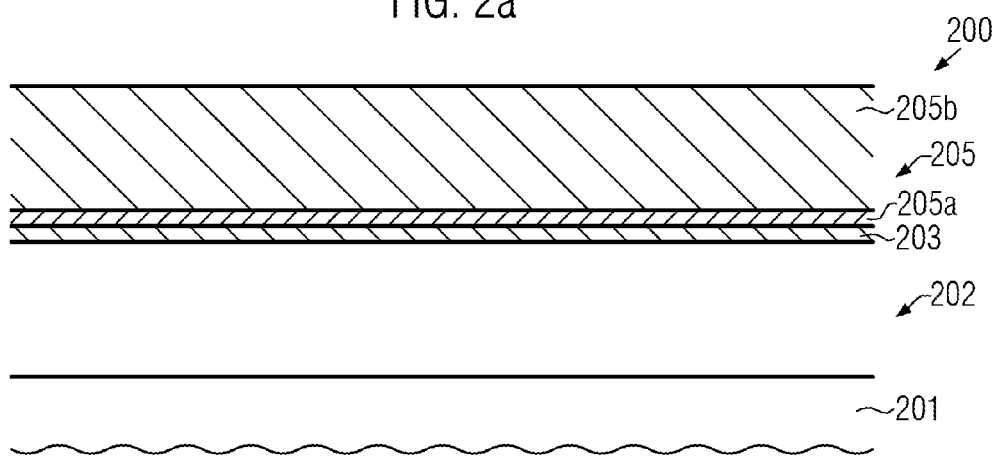
FIG. 2o schematically illustrates a cross-sectional view along a transistor length direction, according to illustrative embodiments.
FIGS. 2p-2t schematically illustrate cross-sectional views of the semiconductor device according to still further illustrative embodiments in which alternative process flows may be used.

FIG. 2b schematically illustrates the device 200 in a manufacturing stage in which a mask layer stack 205 is formed above and, in the embodiment shown, on the semiconductor alloy 203. The layer stack 205 may comprise a first mask layer 205a, for instance provided in the form of a silicon dioxide material having a thickness of several nanometers, for instance approximately 5 nm, wherein other values may also be used, if considered appropriate. A second mask layer 205b may be provided on the basis of a silicon nitride material and the like, wherein a thickness is typically significantly greater, for instance in the range of 50-100 nm, for instance approximately 80 nm. The layer 205a may be formed on the basis of low pressure chemical vapor deposition (CVD) wherein, in this case, a certain modification of the layer 203 may be achieved, for instance in the form of germanium condensation, as is also discussed above, thereby re-adjusting the initially provided material characteristics of the layer 203. Consequently, the additional modification obtained during the deposition of the layer 205a during an low pressure chemical vapor deposition (LPCVD) process may be readily taken into account upon depositing the initial layer 203 and may thus be advantageously used for adjusting the final characteristics of the layer 203 as well as its finally effective layer thickness. In other cases, the layer 205a may be formed on the basis of plasma assisted CVD, thereby using significantly lower process temperatures, which in turn results in a significantly reduced modification of the layer 203. In other cases, atomic layer deposition (ALD) techniques may be applied which provide a highly controllable self-limiting deposition behavior, so that, also in this case, a significant modification of the material characteristics of the layer 203 may be avoided. Similarly, the layer 205b may be provided on the basis of any well-established deposition technique.

Figure 2C:
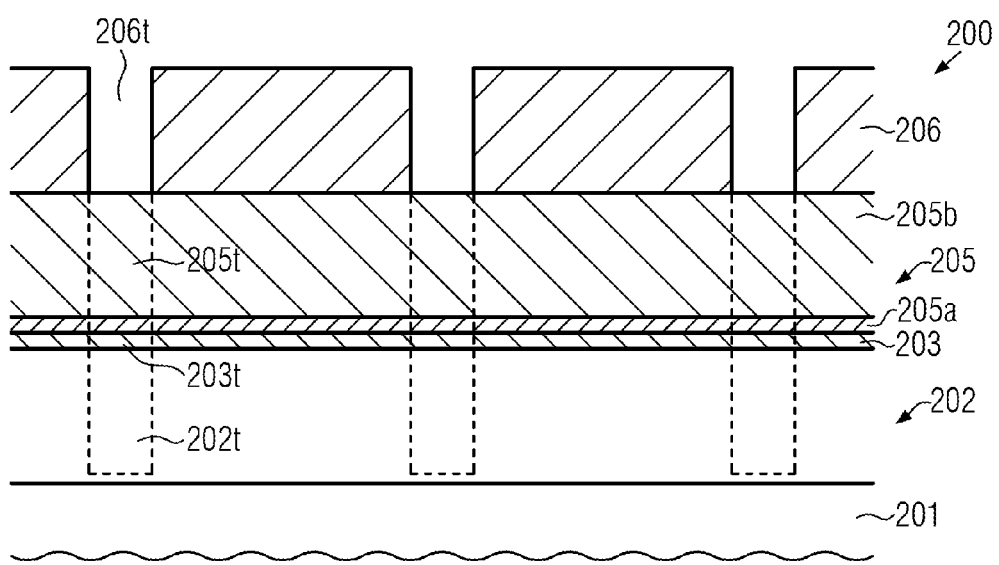

FIG. 2c schematically illustrates the device 200 in a further advanced manufacturing stage. An etch mask 206, such as a resist mask, may be provided above the mask layer stack 205 and may have appropriate trenches or openings 206t, which thus define the lateral size, shape and position of trenches to be formed initially in the layer stack 205, as indicated by 205t, in order to provide an etch mask for the subsequent patterning of the layers 203 and 202. Consequently, the trenches or openings 206t finally define trenches 203t, 202t, which in turn may be subsequently filled with an appropriate dielectric material so as to provide isolation structures.

The etch mask 206 may be formed on the basis of well-established lithography techniques followed by performing anisotropic etch strategies in order to etch into the layer stack 205, wherein the layer 205a may act as an efficient etch stop material. Thereafter, the resist material 206 may be removed and an appropriate etch atmosphere may be established so as to use the patterned layer stack 205 as an etch mask for forming the trenches 203t, 202t, which may also be accomplished on the basis of well-established etch strategies.

Figure 2D:
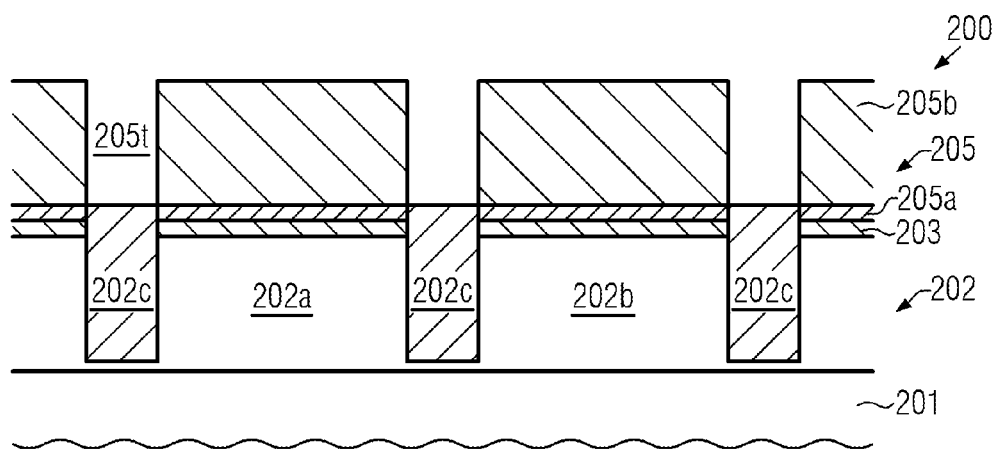

FIG. 2d schematically illustrates the device 200 in a further advanced manufacturing stage in which an isolation structure or region 202c is provided in the semiconductor layer 202 and the threshold voltage adjusting semiconductor material 203, thereby defining the lateral size, position and shape of a plurality of active regions in the semiconductor materials 203, 202. For convenience, a first active region 202a is illustrated that is separated from a second active region 202b by a portion of the isolation region 202c. In the embodiment shown, the active region 202a corresponds to an active region that requires the presence of the alloy 203 in order to obtain the desired transistor characteristics in combination with an appropriate gate electrode structure still to be formed. On the other hand, the layer 203 is to be selectively removed from the active region 202b in order to obtain the desired transistor characteristics in this active region.

The isolation region 202c may be formed by depositing an appropriate dielectric material, such as silicon dioxide and the like, by any appropriate deposition recipe and removing any excess material thereof, for instance by chemical mechanical polishing (CMP) and the like, followed by a further removal process in order to adjust a desired height level of the isolation region 202c. To this end, any well-established wet chemical etch recipes may be applied, for instance on the basis of hydrofluoric acid (HF) and the like.

Figure 2E:
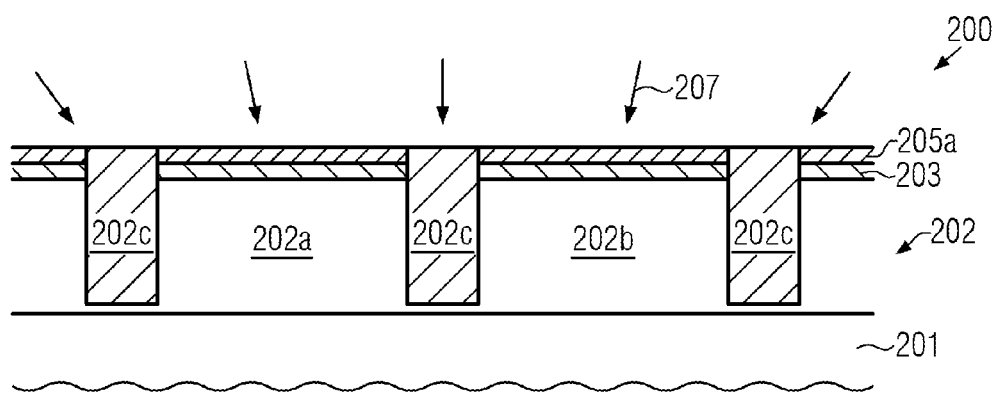

FIG. 2e schematically illustrates the device 200 during the removal of the mask layer 205b (FIG. 2d) selectively with respect to the layer 205a in an etch process 207, which may be performed on the basis of hot phosphoric acid and the like, which exhibits a high selectivity with respect to silicon oxide material. It should be appreciated that, in some illustrative embodiments, any non-uniformities created in the etch stop layer 205a may not negatively affect the further processing since a dedicated hard mask layer may be provided in order to selectively remove the layer 203 from the active region 202b in a later manufacturing stage.

Figure 2F:
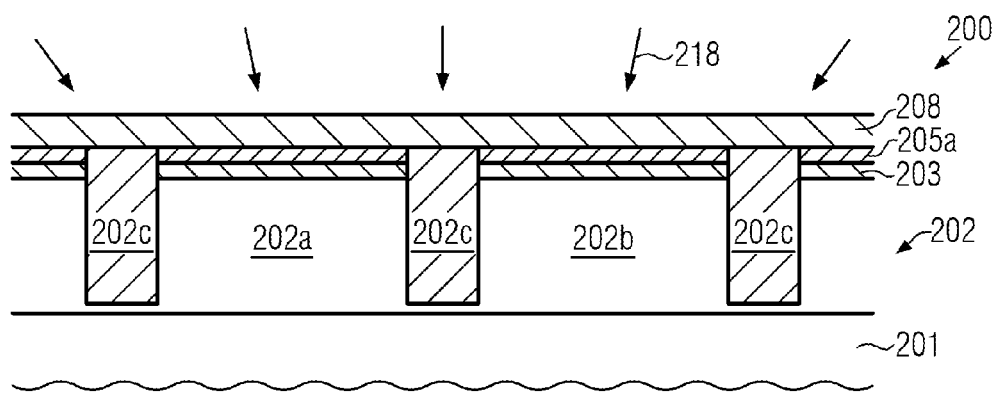

FIG. 2f schematically illustrates the device 200 during a deposition process 218 in which a hard mask layer 208 may be formed on the layer 205a, which may be accomplished on the basis of any well-established deposition recipe. For example, the layer 208 may be provided in the form of a silicon nitride material having a thickness of approximately 10-20 nm, while in other cases any other thickness values may be selected, as long as the required mask capabilities are obtained by the layer 208 during the further processing. In some illustrative embodiments, an additional surface modification or the deposition of a thin non-silicon nitride material may be initiated in order to provide superior process conditions during the further processing when forming a plurality of resist masks, as may be required for incorporating well dopant species into the active regions 202a, 202b. For example, an oxide plasma treatment may be applied to the layer 208 when provided in the form of a silicon nitride material, thereby forming a stable surface layer that efficiently suppresses the diffusion of nitrogen into sensitive resist materials for further processing, thereby avoiding pronounced "resist poisoning."

Figure 2G:
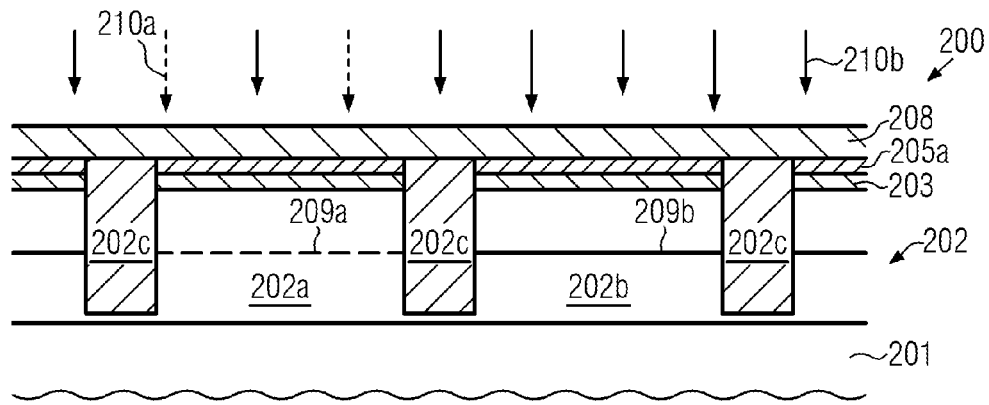

FIG. 2g schematically illustrates the device 200 during a process sequence in which appropriate well dopant species 209a, 209b may be incorporated into the active regions 202a, 202b, respectively. To this end, appropriate implantation masks, such as resist masks (not shown), may be provided so as to selectively expose the active regions 202a, 202b. For example, during an implantation process or sequence 210a, the species 209a may be incorporated into the active region 202a, while the active region 202b is masked by any appropriate mask material. Similarly, during an implantation process 210b, the species 209b is incorporated into the active region 202b. During the implantation processes 210a, 210b, appropriate process parameters in terms of implantation energy are selected so as to take into consideration the presence of the hard mask layer 208 and of the mask layer 205a. Furthermore, compared to conventional strategies, also the presence of the layer 203 above the second active region 202b is to be taken into consideration upon selecting appropriate energy values during the implantation process 210b. It should be appreciated, however, that an appropriate adaptation of implant energies based on conventional implantation recipes may be readily established by simulation, experiments and the like.

Figure 2H:
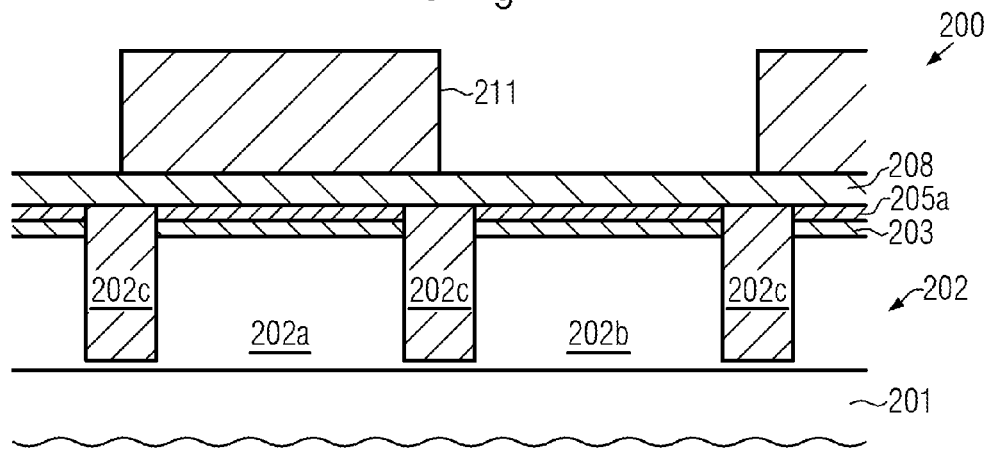

FIG. 2h schematically illustrates the device 200 with a further etch mask 211 provided so as to expose the hard mask layer 208 above the active region 202b, while covering the hard mask layer 208 above the active region 202a. To this end, any well-established lithography and etch techniques may be applied.

Figure 2I:
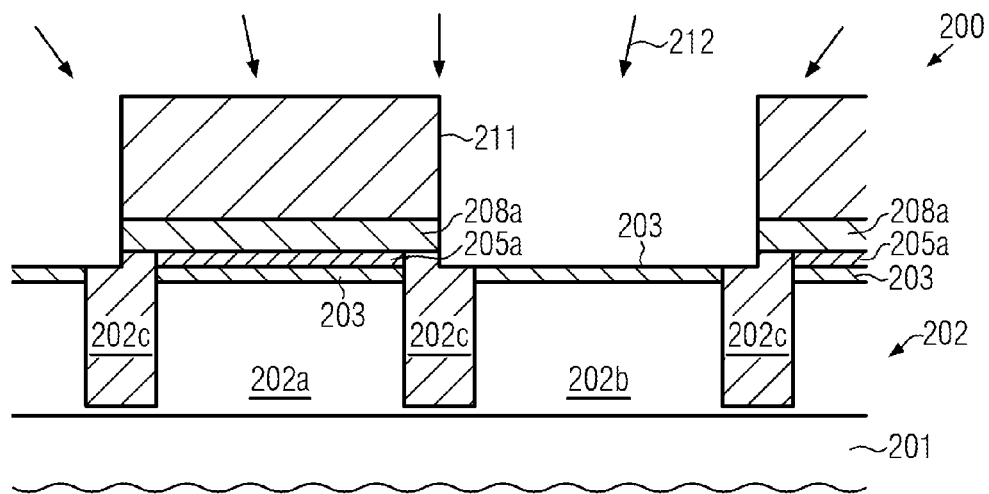

FIG. 2i schematically illustrates the device 200 during a removal process 212 in which the mask 211 is used in order to pattern the hard mask layer 208 (FIG. 2h) in order to provide a patterned hard mask 208a, which covers the active region 202a and a portion of the isolation region 202c. The removal process 212 may comprise an etch process based on a plasma ambient and an appropriate etch chemistry for removing the material of the hard mask 208, for instance in the form of silicon nitride material, while the layer 205a may act as an efficient etch stop material. Thereafter, the layer 205a may be removed, for instance by plasma etching or wet chemical etching. For example, a two-step plasma etch process may be applied in order to remove silicon nitride material and silicon dioxide material. It should be appreciated that a pronounced over-etching during the process 212 may not negatively affect the further processing since the exposed portion of the layer 203 on the active region 202b has to be removed anyway.

Thereafter, the etch mask 211 may be removed and a subsequent wet chemical cleaning process may be performed, thereby exposing the hard mask 208a, which may then be used for selectively removing the exposed portion of the layer 203. In one illustrative embodiment, the sequence 212 including a removal process for the etch mask 211 and a corresponding cleaning process may be selected such that the cleaning process may also be used for removing the layer 203 from above the active region 202b. To this end, the cleaning process may be applied on the basis of APM (ammonium hydroxide/ hydrogen peroxide mixture) at elevated temperatures, thereby efficiently removing silicon/germanium material selectively with respect to silicon, silicon oxide, silicon nitride and the like.

Figure 2J:
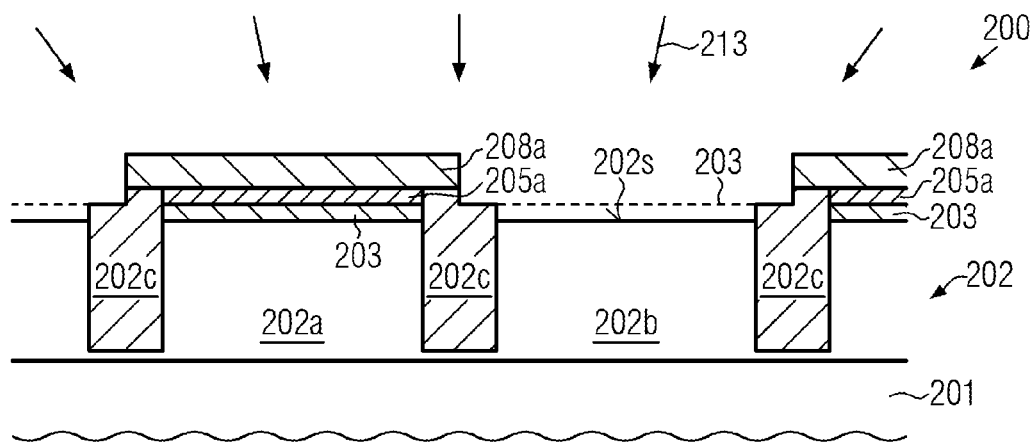

FIG. 2*j* schematically illustrates the device 200 in which an exposed portion of the layer 203 is removed during a specific removal process 213, in which the hard mask 208*a* reliably preserves integrity of the material 203 in the active region 202*a*. During the etch process 213, well-established wet chemical etch recipes, such as hot APM, as discussed above, may be used in order to efficiently remove the material 203, thereby exposing a surface 202*s* of the semiconductor base material of the active region 202*b*.

Figure 2K:
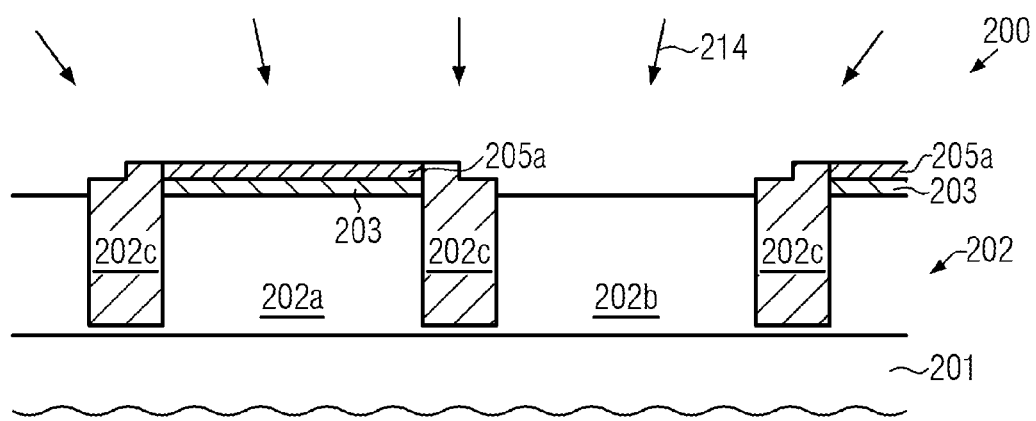

FIG. 2*k* schematically illustrates the semiconductor device 200 during a further removal process 214, which may be applied on the basis of hot phosphoric acid and the like, in order to remove the hard mask 208*a* (FIG. 2*j*). As is well known, hot phosphoric acid may provide high selectivity with respect to silicon dioxide, silicon and the like, thereby not unduly affecting the exposed base material of the active region 202*b*. On the other hand, the material 203 is still reliably covered by the mask layer 205*a*.

Figure 2L:
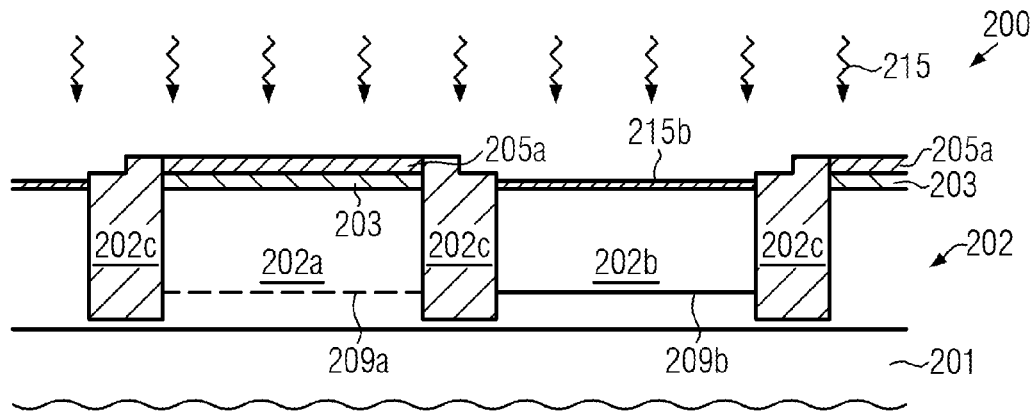

FIG. 2*l* schematically illustrates the device 200 according to some illustrative embodiments in which a high temperature process 215, also referred to as an anneal process, may be applied in order to stabilize or activate the previously introduced dopant species 209*a*, 209*b*, while at the same time at least significantly reducing implantation-induced crystal damage in the active regions. To this end, any well-established anneal techniques may be applied with temperatures of approximately 700° C. or significantly higher or a process time that is appropriate in order to obtain the desired characteristics. For example, rapid thermal anneal (RTA) process techniques, laser-based process techniques, flashlight-based process techniques and the like may be efficiently applied. Furthermore, during the anneal process 215, lattice damage caused in the material 203 during the previous implantation processes may also be efficiently cured or reduced, thereby re-establishing a high crystalline quality in this material. Furthermore, during the high temperature process 215, a thin layer of native oxide, indicated as 215*b*, may form on exposed portions of the active region 202*b*, wherein typically a thickness of the layer 215*b* may be in the range of approximately 2-4 nm, depending on the overall process parameters of the process 215.

Figure 2M:
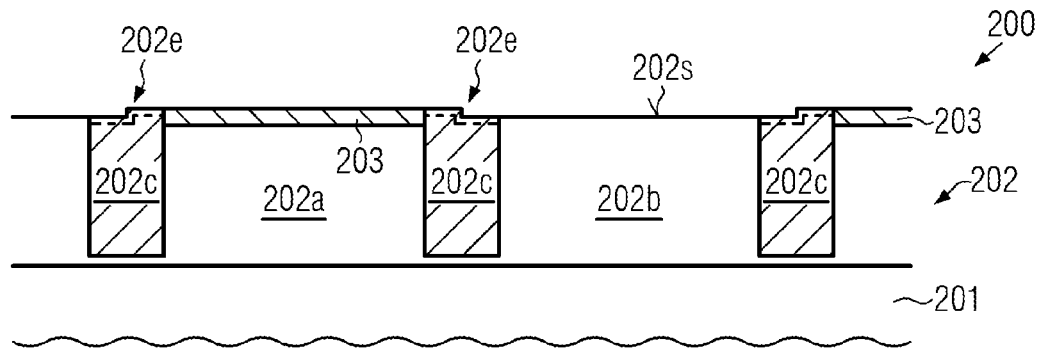

FIG. 2*m* schematically illustrates the device 200 in a further advanced manufacturing stage in which the layer 203 may be exposed and the surface 202*s* may be re-established in the active region 202*b*. To this end, the layers 205*a*, 215*b* (FIG. 2*l*) may be removed on the basis of any appropriate etch or cleaning recipe, thereby also removing contaminants in order to prepare the device 200 for the formation of a desired gate dielectric material. To this end, any well-established wet chemical cleaning or etch recipes may be applied. In some illustrative embodiments, as indicated by the dashed line 202*e* in the isolation regions 202*c*, an adjustment of the overall height of the isolation region 202*c* with respect to the adjacent active regions 202*a*, 202*b* may be achieved, for instance, by appropriately controlling the etch parameters during the subsequent removal of any oxide materials, if a corresponding least height of the semiconductor materials compared to the adjacent dielectric material of the isolation structures 202*c* is considered appropriate for the further processing. Based on the surface configuration as shown in FIG. 2*m*, if required, a thin oxide material may be formed, for instance by chemical oxidation and the like, in order to provide well-defined interface characteristics for a gate dielectric material still to be formed. For example, frequently, a high-k dielectric material may be provided in combination with a conventional dielectric material, such as silicon dioxide, in order to provide well-defined and superior interface characteristics. It should be appreciated that, due to the superior uniformity of the surface 202*s* and of the layer 203, since substantially any non-uniformity at the vicinity of the isolation regions 202*c* may be avoided during the early formation of the layer 203, also superior uniformity of a corresponding oxide material may be achieved.

Figure 2N:
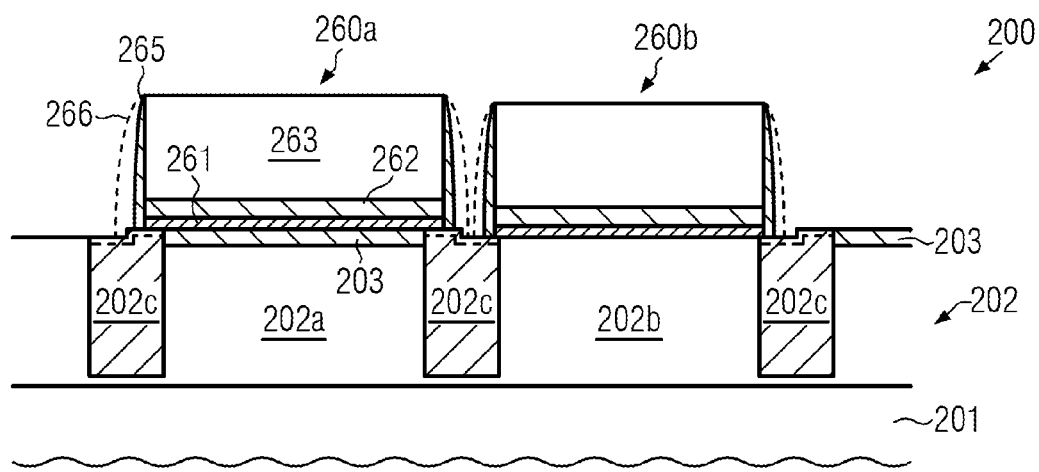

FIG. 2*n* schematically illustrates the device 200 in a further advanced manufacturing stage. As shown, a first gate electrode structure 260*a* may be formed on the active region 202*a*, i.e., on the threshold voltage adjusting semiconductor alloy 203, which is to be considered as a part of the active region 202*a*. Similarly, a second gate electrode structure 260*b* is formed on the second active region 202*b*. Basically, the gate electrode structures 260*a*, 260*b* may have the same configuration and may comprise a gate dielectric layer 261 which, as indicated above, may include, at least in the area within the corresponding active regions, a conventional dielectric material, such as an oxide material and the like. Furthermore, in some illustrative embodiments, the gate dielectric layer 261 may comprise a high-k dielectric material, for instance one or more of the materials as discussed above, in order to obtain a desired physical thickness of the layer 261 and increased capacitive coupling compared to a conventional gate dielectric material. Moreover, typically, a metal-containing electrode material 262 may be provided, for instance in the form of titanium nitride and the like, followed by a further electrode material 263, such as silicon, silicon/germanium and the like. It should be appreciated that the materials 261 and 262 may have different characteristics in order to address the different requirements for transistor elements to be formed on the basis of the gate electrode structures 260*a*, 260*b*. That is, typically an appropriate work function metal species, such as aluminum, may be incorporated in the layer 261 and/or 262 for P-channel transistors, while appropriate metal species, such as lanthanum, may be incorporated in the layer 261 and/or 262 of N-channel transistors. Hence, as discussed above, in combination with the layer 203 having the superior uniformity, the gate electrode structure 260*a* may provide the required threshold voltage characteristics of a transistor still to be formed in and above the active region 202*a*. Similarly, the gate electrode structure 260*b* in combination with the base material of the active region 202*b* may provide the required threshold voltage characteristics of a transistor still to be formed.

Furthermore, in this manufacturing stage, a liner or spacer 265 may be provided so as to ensure integrity of the sensitive materials 261 and 262 with respect to the further processing of the device 200, as is also previously discussed with reference to the semiconductor device 100. It should be appreciated that, depending on the manufacturing stage, a dielectric cap layer or cap layer system (not shown) may still be formed on the electrode material 263, while in other cases, as shown, any such material may have been removed in an earlier manufacturing stage. Furthermore, in this stage, a spacer structure 266 may be provided so as to enable the definition of a lateral dopant profile to be formed in the active regions 202*a*, 202*b* when providing drain and source regions (not shown).

The device 200 as shown in FIG. 2*n* may be formed on the basis of the following processes. After preparing the material 203 and the base material in the active region 202*b* for the deposition of the gate dielectric material 261, which may possibly include the oxidation or any other surface modification, an appropriate material may be deposited, for instance a high-k dielectric material using well-established deposition regimes such as ALD and the like. Thereafter, one or more metal-containing electrode materials may be deposited and may possibly be patterned so as to finally provide an appropriate metal species and electrode material above the active regions 202a, 202b, respectively. To this end, well-established deposition and patterning regimes may be applied, possibly in combination with a thermal treatment, in order to, for instance, diffuse a work function metal species into the dielectric material 261. Next, the layer 263 may be formed, followed by the deposition of any sacrificial material layers, such as dielectric cap layers and the like, and subsequently the resulting layer stack may be patterned on the basis of sophisticated lithography and etch techniques, wherein, if required, double exposure-double etch strategies may be applied. It should be appreciated that during this complex patterning process the superior surface topography at the transition between the active regions and the isolation region 202c may significantly reduce any patterning-related irregularities. In particular, a pronounced surface topography of the isolation regions 202c may be avoided and in particular the layer 203 may have a highly uniform configuration across the entire active region 202a. Consequently, also the deposition of a liner material and the subsequent patterning thereof may result in superior encapsulation of the sensitive materials 261 and 262 by the spacer 265.

Next, any process steps may be formed, for instance for incorporating strain-inducing semiconductor materials in one or both of the active regions 202a, 202b in the presence of the gate electrode structures 260a, 260b, while, in other cases, drain and source regions may be formed, for instance by implantation techniques, using at a certain stage of the implantation sequence the spacer structure 266 as an implantation mask.

Figure 2O:
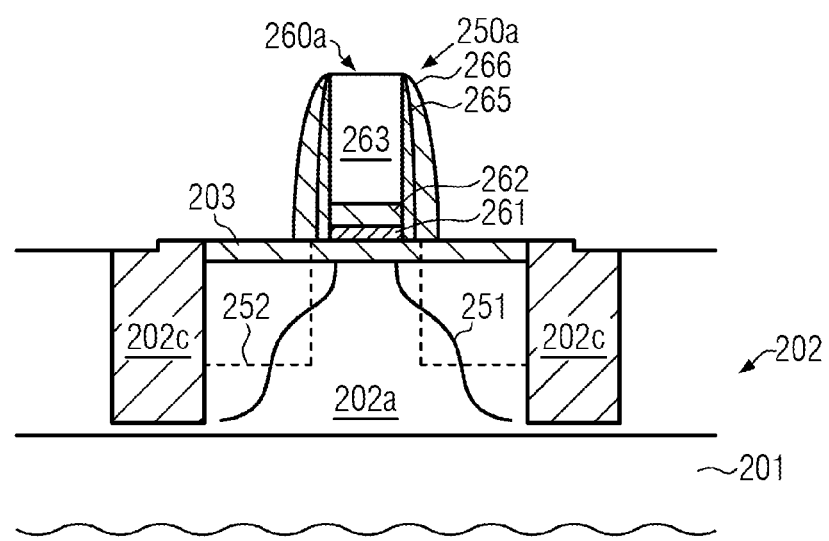

FIG. 2o schematically illustrates the semiconductor device 200 in a cross-sectional view taken along a transistor length direction contrary to, for instance, the cross-sectional view of FIG. 2n, in which the active regions 202a, 202b are illustrated along a width direction, as is, for instance, also explained with reference to the semiconductor device 100. As shown, the device 200 may comprise a transistor 250a formed in and above the active region 202a which includes, at least under a portion of a gate electrode structure 260a, the threshold voltage adjusting semiconductor alloy 203 having the superior uniformity with respect to material composition and layer thickness. In this manufacturing stage, the gate electrode structure 260a may comprise the gate dielectric layer 261, the electrode material 262, the electrode material 263, the spacer 265 and the spacer structure 266. The length of the gate electrode structure 260a may be 50 nm and less in sophisticated applications, as is also discussed above. Moreover, drain and source regions 251 may be formed in the active region 202a with an appropriate lateral and vertical profile in order to provide, in combination with the material 203 and the gate electrode structure 260a, an appropriate threshold voltage of the transistor 250a. In some illustrative embodiments, as discussed above, a straininducing material 252 may be formed in a portion of the active region 202a, for instance in the form of a silicon/germanium material, or generally on the basis of an atomic species having a greater covalent radius compared to silicon material when compressive strain is required in the active region 202a.

The transistor 250a may be formed on the basis of well-established process techniques, for instance by forming the drain and source regions 251 by implantation techniques, while, in other cases, when the material 252 may be incorporated, for instance by epitaxial growth techniques, at least a part of the drain and source dopant species may also be incorporated during the epitaxial growth process. It should be appreciated that other transistors, which do not require the material 203, may be formed concurrently with the transistor 250a on the basis of well-established process strategies.

Figure 2P:
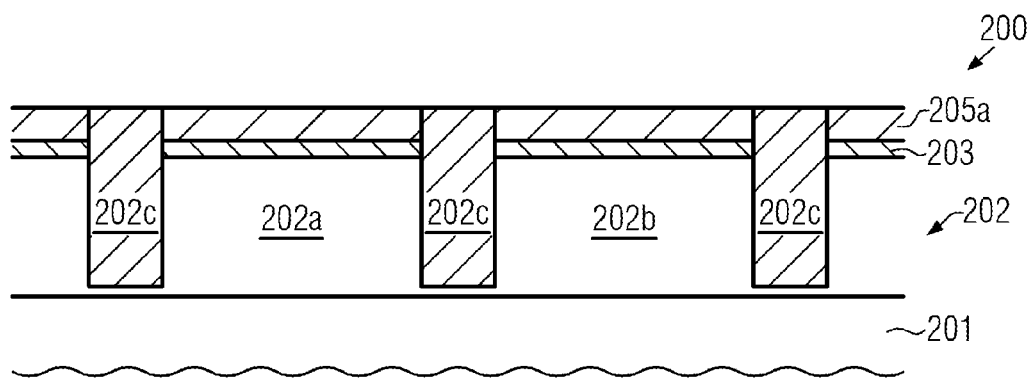

FIG. 2p schematically illustrates the semiconductor device 200 according to further illustrative embodiments in which the semiconductor alloy 203 may be formed prior to providing the isolation regions 202c, as discussed above, wherein, however, the isolation regions 202c may be formed on the basis of mask layers in which the mask layer 205a may have an appropriate thickness so as to act as a hard mask material during the further processing, i.e., during the selective removal of the layer 203 from above the active region 202b. To this end, the material 205a may be deposited with an appropriate initial thickness of, for instance, 10-20 nm or, for instance, 10-50 nm, followed by the deposition of a silicon nitride material, as is also discussed above. Thereafter, the further processing may be continued as also described above, for instance, in order to form the isolation region 202c, remove any excess material, including the silicon nitride material, and incorporate well dopant species into the active regions 202a, 202b. In this case, appropriately adapted process parameters, in particular implant energy, have to be used in order to take into consideration the configuration as shown in FIG. 2p.

Figure 2Q:
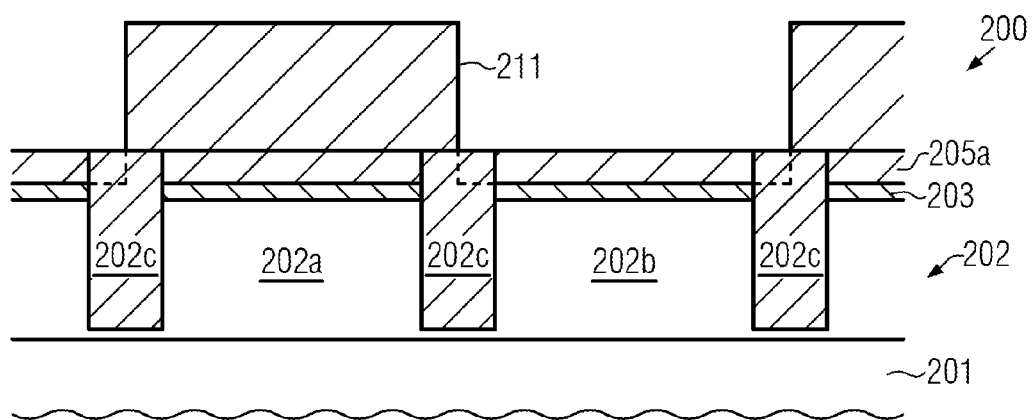

FIG. 2q schematically illustrates the device 200 with the etch mask 211 formed above the active region 202a, as is also previously described. During a subsequent etch process, the layer 205a may be selectively removed from above the active region 202b in order to expose the layer 203. To this end, plasma assisted or wet chemical etch recipes may be applied, wherein a corresponding portion of the isolation structures 202c may also be removed, as indicated by the dashed line. Thereafter, the mask 211 may be removed in combination with a corresponding wet chemical cleaning process which may also remove the exposed portion of the layer 203. In other cases, a dedicated removal process may be applied for removing the exposed portion of the layer 203 while using the remaining portion of the layer 205a as a hard mask. Thereafter, the further processing may be continued as discussed above in order to form gate electrode structures and transistor elements.

Figure 2R:
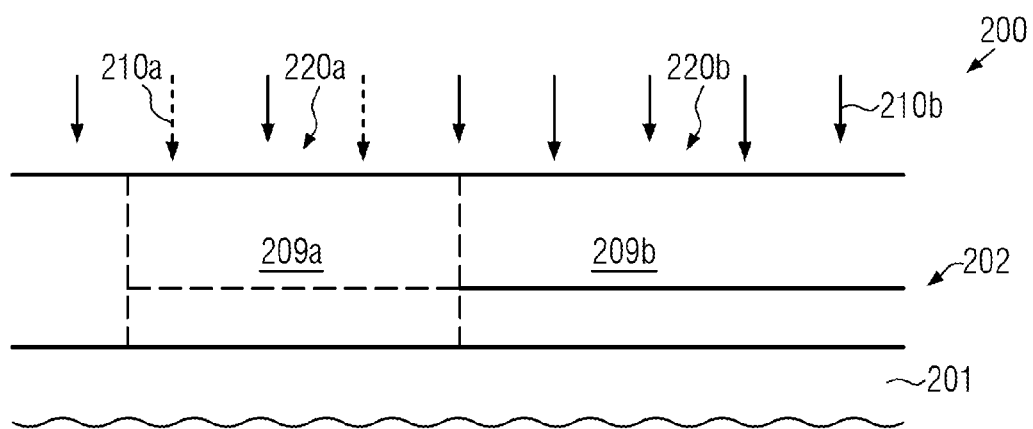
Figure 2S:
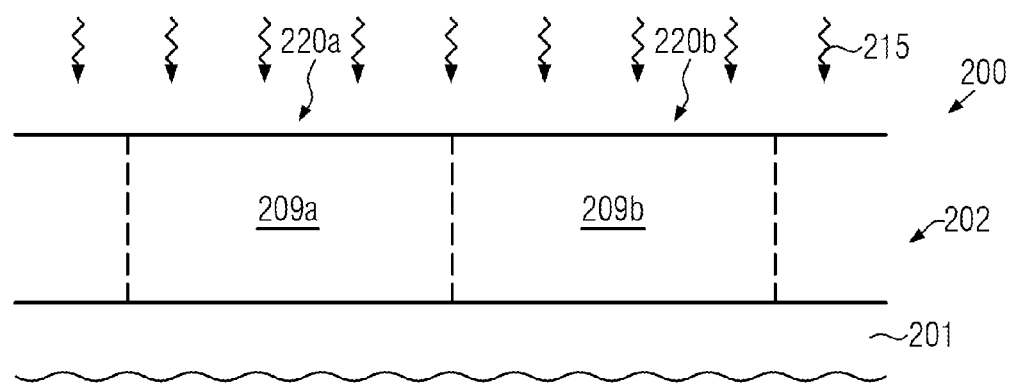
Figure 2T:
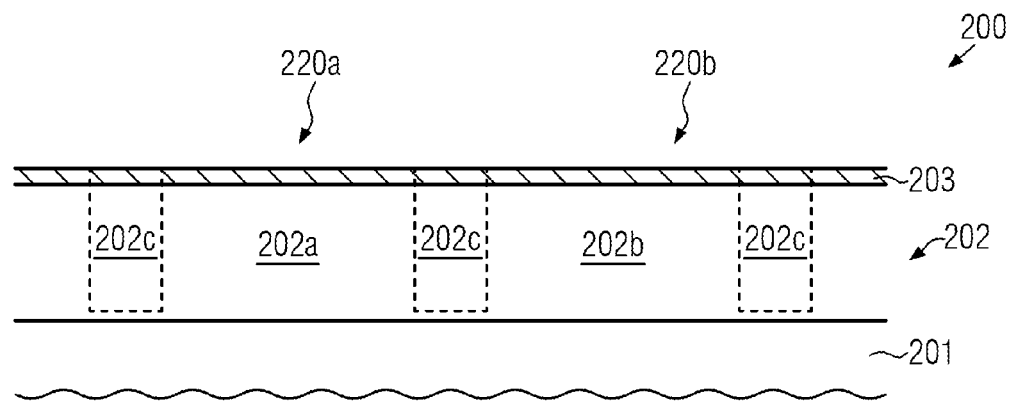

With reference to FIGS. 2r-2t, further illustrative embodiments will now be described in which the incorporation of well dopant species may be accomplished prior to forming isolation structures and prior to growing a threshold voltage adjusting semiconductor alloy.

FIG. 2r schematically illustrates the semiconductor device 200 in an early manufacturing stage in which a sequence of masking and implantation processes 210a, 210b is applied so as to incorporate the well dopant species 209a, 209b into corresponding areas 220a, 220b, prior to actually defining the lateral size, position and shape of active regions. To this end, the process sequences 210a, 210b may be performed as is also discussed above, wherein, however, appropriately adapted implant parameters may be applied.

FIG. 2s schematically illustrates the device 200 during the anneal process 215 in order to activate or thermally stabilize the well dopant species 209a, 209b in the areas 220a, 220b. Furthermore, during the process 215, implantation-induced damage may be re-crystallized, at least to a high degree, thereby providing superior crystalline quality of the areas 220a, 220b prior to growing a threshold voltage adjusting semiconductor alloy.

FIG. 2t schematically illustrates the device 200 with the semiconductor alloy 203 formed on the areas 220a, 220b thereby providing superior growth conditions, as also previously discussed. Furthermore, within the area 220a, the active region 202a may be defined on the basis of the isolation region 202c, as indicated by dashed lines, in a later manufacturing stage. Similarly, the active region 202b may be formed within the area 220b in a later manufacturing stage upon forming the isolation region 202c. To this end, similar process strategies may be used as described above wherein, however, the crystalline quality of the material 203 may not be substantially affected since any well dopant species are already incorporated in the areas 220a, 220b. Hence, the further processing may be continued as described above, or as will be described later on, however, without requiring the incorporation of any further well dopant species.

Figure 3:
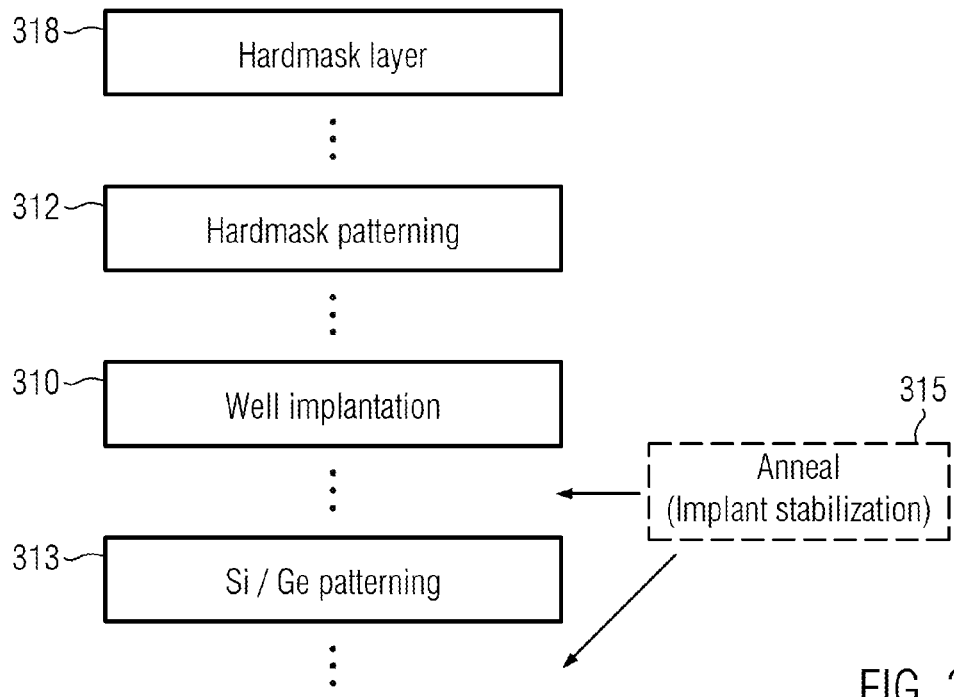
FIGS. 3-5 schematically illustrate various process flows for appropriately implementing well implantation processes and associated anneal processes into a process scheme for forming the threshold voltage adjusting semiconductor alloy prior to forming isolation regions, according to still other illustrative embodiments.

FIG. 3 schematically illustrates a process flow in which the semiconductor device 200 as described above may be provided on the basis of a different sequence of process steps. For example, basically, the threshold voltage adjusting semiconductor material may be formed prior to forming isolation regions, as is also discussed above, wherein a step 318 for providing a hard mask layer may be performed at any appropriate stage of process flow, for instance a dedicated hard mask material may be deposited as previously described with reference to FIG. 2f. Thereafter, in step 312, the hard mask layer may be patterned, for instance as previously described with reference to FIG. 2i, followed by a step 310 in which well dopant species may be incorporated into the active regions 202a, 202b, as for instance described with reference to FIG. 2g. In a later stage, a step 313 may be performed in order to selectively remove the threshold voltage adjusting semiconductor alloy, as, for instance, described with reference to FIG. 2j.

It should be appreciated that the sequence of the steps of hard mask patterning 312, well implantation 310 and patterning of the threshold voltage adjusting semiconductor material 313 is different compared to the previously described process sequence. Hence, a certain degree of flexibility in designing the overall process flow may be achieved, thereby enhancing overall scheduling efficiency and thus enhancing throughput for given hardware resources of a manufacturing environment.

Furthermore, an anneal step 315, as previously discussed with reference to FIG. 2l, may be implemented at any appropriate position after the well implantation step 310 and/or step 313, thereby also providing superior flexibility in scheduling the overall process flow.

Figure 4:
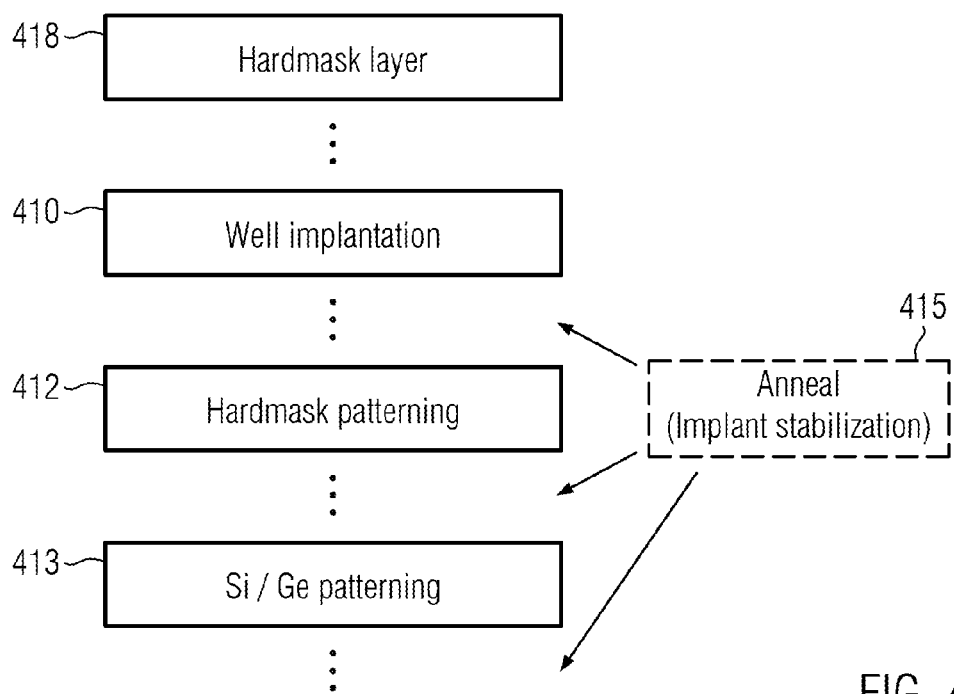

FIG. 4 schematically illustrates a further alternative for implementing the above-described concept to the overall process flow. As shown, a step 418 for forming the hard mask layer is followed at a certain stage by the step 410, including the well implantation process sequences as described above, followed by the step 412, i.e., the hard mask patterning, and finally the step 413 is performed so as to selectively remove the threshold voltage adjusting semiconductor alloy. In this case, the well implantations are performed between the deposition of the hard mask layer 418 and the hard mask patterning 412, while in this case the step 415 of implementing the anneal process may be performed between the steps 410 and 412, or between the steps 412 and 413, or after the step 413.

Figure 5:
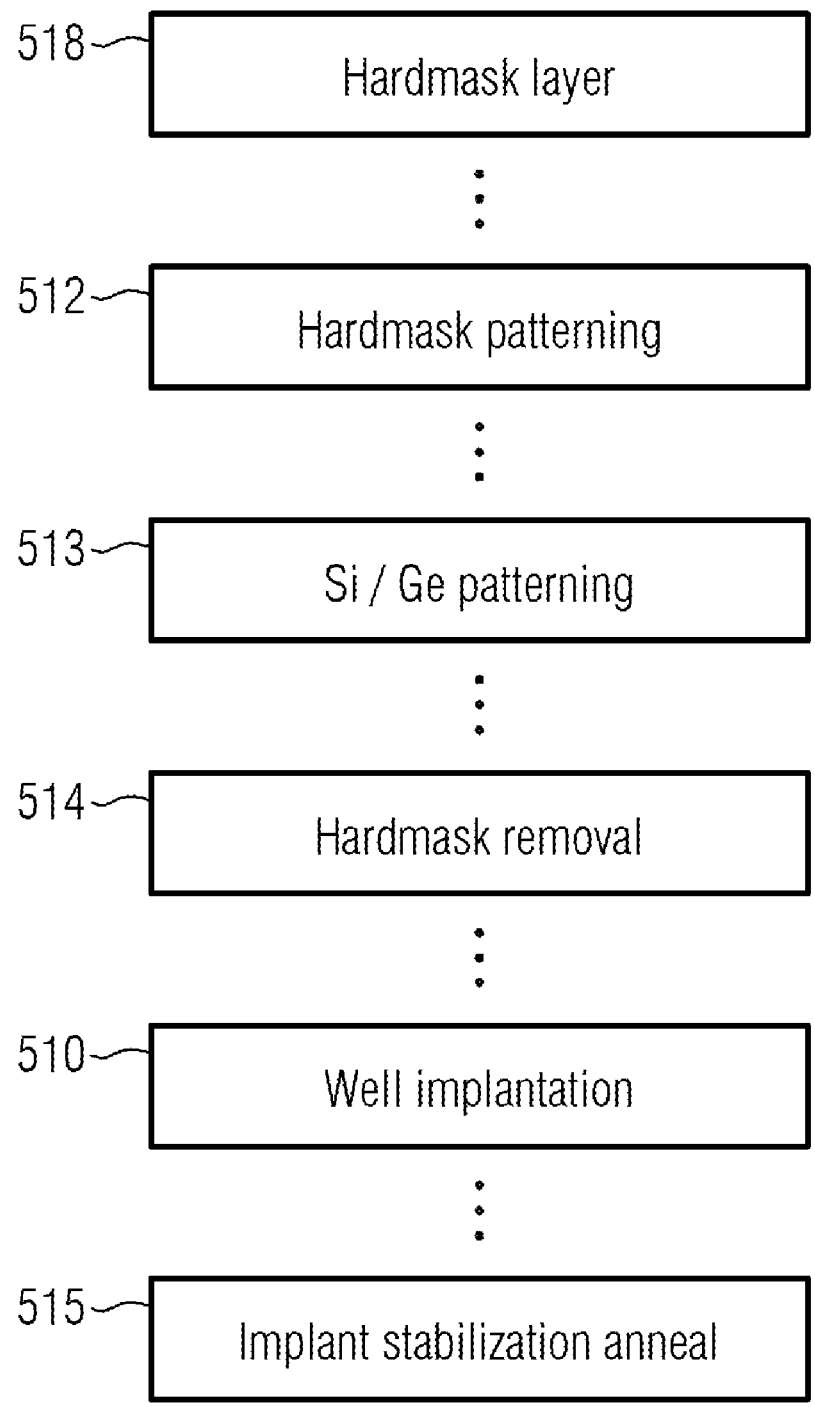

FIG. 5 schematically illustrates the process flow based on step 518, i.e., hard mask formation, step 512, i.e., hard mask patterning, step 513, i.e., patterning of the threshold voltage adjusting semiconductor material or selective removal, step 514, i.e., hard mask removal, step 510, i.e., well implantation and step 515, i.e., anneal process. Hence, in this sequence, the well dopant species are incorporated at step 510 after the hard mask removal 514, i.e., on the basis of surface conditions in which well-established implantation parameters may be used since any additional hard mask materials may not have to be taken into consideration.

As a result, the present disclosure provides manufacturing techniques in which the advantageous concept of providing a uniform threshold voltage adjusting semiconductor material prior to forming isolation structures may be efficiently implemented into the overall process flow for forming sophisticated gate electrode structures, for instance including a high-k dielectric material, in order to obtain a high crystalline quality of the semiconductor alloy by appropriately selecting the point in time for incorporating the well dopant species and performing an associated anneal process. Thus, with reference to FIGS. 2a-2t and the embodiments described with reference to FIGS. 3-5, a plurality of advantageous variants in appropriately organizing the overall process flow are described. Furthermore, high throughput etch processes may be used for growing the threshold voltage adjusting semiconductor alloy, thereby contributing to superior process efficiency. Compared to conventional strategies in which the semiconductor alloy may be provided on the basis of selective epitaxial growth techniques requiring the subsequent removal of the hard mask, any additional masking processes may be avoided, which are typically implemented in order to provide superior symmetry with respect to the induced surface topography in isolation regions. In this respect, the present disclosure results in superior surface topography since pronounced divots may be avoided, while at the same time the desired high degree of uniformity of the threshold voltage adjusting semiconductor material is achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming an isolation structure in a semiconductor layer of a semiconductor device and in a threshold voltage adjusting semiconductor alloy formed on said semiconductor layer, said isolation structure laterally separating a first active region and a second active region;
    introducing a first well dopant species into said first active region and a second well dopant species into said second active region, said first and second well dopant species being introduced through said threshold voltage adjusting semiconductor alloy;
    removing said threshold voltage adjusting semiconductor alloy selectively from said second active region having formed therein said second well dopant species; and
    forming a first gate electrode structure of a first transistor on said threshold voltage adjusting semiconductor alloy of said first active region and forming a second gate electrode structure of a second transistor on said second active region.

2. The method of claim 1, further comprising forming a hard mask layer above said first and second active regions and above said isolation structure prior to introducing said first and second well dopant species.

3. The method of claim 2, further comprising removing said hard mask layer selectively from above said second active region.

4. The method of claim 1, further comprising forming a first hard mask layer above said threshold voltage adjusting semiconductor alloy, forming a second hard mask layer above said first hard mask layer, forming said isolation structure by using said first and second hard mask layers and using said first hard mask layer after removal of said second hard mask layer so as to selectively remove said threshold voltage adjusting semiconductor alloy from said second active region.

5. The method of claim 1, further comprising performing an anneal process so as to activate said first and second well dopant species.

6. The method of claim 5, wherein said anneal process is preformed prior to removing said threshold voltage adjusting semiconductor alloy selectively from said second active region.

7. The method of claim 6, wherein said anneal process is performed after forming a hard mask layer and prior to patterning said hard mask layer and prior to using said patterned hard mask layer so as to selectively remove said threshold voltage adjusting semiconductor alloy.

8. The method of claim 5, wherein said anneal process is performed after selectively removing said threshold voltage adjusting semiconductor alloy.

9. The method of claim 1, wherein forming said first and second gate electrode structures comprises providing a gate dielectric layer that comprises a high-k dielectric material.

10. The method of claim 1, wherein forming said threshold voltage adjusting semiconductor alloy comprises providing a plurality of substrates having formed thereon said semiconductor layer and epitaxially growing said threshold voltage adjusting semiconductor alloy commonly on the semiconductor layer of said plurality of substrates.

11. A method, comprising:
forming an isolation structure in a semiconductor layer of a semiconductor device and in a threshold voltage adjusting semiconductor alloy formed on said semiconductor layer, said isolation structure laterally separating a first active region and a second active region;
forming a hard mask so as to expose said threshold voltage adjusting semiconductor alloy of said second active region;
introducing a first well dopant species into said first active region and a second well dopant species into said second active region in the presence of said hard mask;
removing said threshold voltage adjusting semiconductor alloy selectively from said second active region by using said hard mask; and
forming a first gate electrode structure of a first transistor on said threshold voltage adjusting semiconductor alloy of said first active region and forming a second gate electrode structure of a second transistor on said second active region.

12. The method of claim 11, wherein forming said hard mask comprises forming a first hard mask layer and a second hard mask layer, using said first and second hard mask layers when forming said isolation structure, removing said second hard mask layer and patterning said first hard mask layer as said hard mask.

13. The method of claim 11, wherein forming said hard mask comprises forming a hard mask layer above said first and second active regions and said isolation structure and patterning said hard mask layer.

14. The method of claim 13, wherein said hard mask layer is formed so as to comprise a silicon and nitrogen compound.

15. The method of claim 11, wherein said threshold voltage adjusting semiconductor alloy is selectively removed after introducing at least one of said first and second well dopant species.

16. The method of claim 11, further comprising removing said hard mask, wherein at least one of said first and second well dopant species is introduced after removal of said hard mask.

17. The method of claim 11, further comprising performing an anneal process so as to activate said first and second well dopant species.

18. The method of claim 17, wherein said anneal process is performed prior to selectively removing said threshold voltage adjusting semiconductor alloy.

19. The method of claim 17, wherein said anneal process is performed after selectively removing said threshold voltage adjusting semiconductor alloy.

20. A method comprising:
introducing a first well dopant species and a second well dopant species into a first area and a second area, respectively, of a semiconductor layer of a semiconductor device;
forming a threshold voltage adjusting semiconductor alloy above said semiconductor layer;
forming an isolation structure in said semiconductor layer and in said threshold voltage adjusting semiconductor alloy, said isolation structure laterally separating a first active region and a second active region, said first active region being formed within said first area and said second active region being formed within said second area;
removing said threshold voltage adjusting semiconductor alloy selectively from said second active region by using a hard mask; and
forming a first gate electrode structure of a first transistor on said threshold voltage adjusting semiconductor alloy of said first active region and forming a second gate electrode structure of a second transistor on said second active region, said first and second gate electrode structures comprising a gate dielectric layer including a high-k dielectric material.

* * * * *